(12) United States Patent
Pornin et al.

(10) Patent No.: US 7,786,561 B2
(45) Date of Patent: Aug. 31, 2010

(54) ENCAPSULATED MICROCOMPONENT EQUIPPED WITH AT LEAST ONE GETTER

(75) Inventors: Jean-Louis Pornin, Crolles (FR); Charlotte Gillot, Grenoble (FR); Francois Baleras, Saint Georges de Commiers (FR)

(73) Assignee: Commissariat A l'Energie Atomique, Paris (FR)

( * ) Notice: Subject to any disclaimer, the term of this patent is extended or adjusted under 35 U.S.C. 154(b) by 0 days.

(21) Appl. No.: 11/774,200

(22) Filed: Jul. 6, 2007

(65) Prior Publication Data
US 2008/0049386 A1 Feb. 28, 2008

(30) Foreign Application Priority Data
Jul. 13, 2006 (FR) .................... 06 52978

(51) Int. Cl.
*H01L 23/20* (2006.01)
(52) U.S. Cl. ........................ 257/682; 257/704
(58) Field of Classification Search ................ 257/682, 257/E21.501, E23.137, 704
See application file for complete search history.

(56) References Cited
U.S. PATENT DOCUMENTS
6,039,620 A * 3/2000 Itoh et al. ................. 445/25

| | | | |
|---|---|---|---|
| 2002/0063322 A1 | 5/2002 | Robbins et al. | |
| 2003/0183916 A1 | 10/2003 | Heck et al. | |
| 2005/0017313 A1 | 1/2005 | Wan | |
| 2005/0250253 A1 | 11/2005 | Cheung | |
| 2007/0023890 A1* | 2/2007 | Haluzak et al. | 257/704 |

FOREIGN PATENT DOCUMENTS

| FR | 2 864 341 A1 | | 6/2005 |
|---|---|---|---|
| JP | 2003-217463 | * | 7/2003 |
| WO | WO 02/27058 A1 | | 4/2002 |
| WO | WO 2004/065289 A2 | | 8/2004 |
| WO | WO 2005/047558 A2 | | 5/2005 |

* cited by examiner

*Primary Examiner*—Steven Loke
*Assistant Examiner*—Kimberly M Thomas
(74) *Attorney, Agent, or Firm*—Oblon, Spivak, McClelland, Maier & Neustadt, L.L.P.

(57) ABSTRACT

The invention relates to an encapsulated microcomponent having a cover (3) delimiting a sealed cavity (4) equipped with at least one orifice (5) provided with a plug (6). The plug (6) comprises a getter material portion (6.1) exposed inside the cavity (4).

Application in particular in MEMS.

7 Claims, 6 Drawing Sheets

ENCAPSULATED MICROCOMPONENT EQUIPPED WITH AT LEAST ONE GETTER

TECHNICAL FIELD

This invention relates to an encapsulated microcomponent comprising a sealed cavity delimited by a cover, which cavity is equipped with at least one getter (also called gas collector) intended to trap gases that may be located in the cavity.

The encapsulation of electromechanical microsystems known as MEMS is today an essential part of their development. Other electronic, optical and optoelectronic microcomponents can also be involved in this encapsulation. Below, we have used the term microcomponent, which in this case encompasses a microsystem or an electronic, optical or optoelectronic microcomponent. Integrated circuits are included under the category of electronic, optical or optoelectronic microcomponents.

An increasing number of these microcomponents operate under vacuum or reduced pressure because the presence of gas can adversely affect the operation. This is especially the case for microcomponents that have mobile portions. The quality of the operation is associated with the control of the vacuum obtained during the encapsulation in terms of pressure, residual or released gases, but also in terms of lifetime.

A getter in the form of a discrete element or in the form of a film must be placed near the microcomponent, and will contribute to reducing or stabilising the pressure in the cavity by absorbing residual gases emitted by various parts present in the cavity, and molecules that may pass through the cover over time.

PRIOR ART

There are various types of solutions in this field today.

The microcomponent can be encapsulated in a metal or ceramic casing and this casing is large enough to receive a discrete getter in the environment close to the microcomponent. The available discrete getters have a surface of some hundreds of square micrometers and a thickness of some dozens or even hundreds of micrometers. The vacuum is created when the cover is sealed to the base portion or with the assistance of a tip provided for this purpose. The casing is then much larger than the microcomponent that it contains. This solution is incompatible with the miniaturisation that is increasingly desirable today. In addition, it is necessary to take into account the problems encountered when attaching the getter in the cavity and when thermally activating it. The getter is in place well before the microcomponent is completed, and it risks being partially saturated when the encapsulated microcomponent is completed. There is also a risk of a release of particles that are absorbed during the production process and released later in the life microcomponent.

Although these particles are fine, they can adversely affect the operation of the microcomponent.

In addition, such a structure is not compatible with encapsulation processes at the wafer level, known as Wafer Level Packaging. These processes consist of performing the encapsulation collectively of all of the microcomponents produced on the same semiconductor material wafer. These processes are used increasingly because they make it possible to further miniaturise the components and significantly reduce the costs of production.

It has also been proposed to place, by anode sealing, eutectic welding or the like, a cover on a substrate supporting the microcomponent. The getter takes the form of a discrete element or a thin film and is placed in the cavity defined by the cover. The problems of bulk, saturation and gas release still exist.

In the patent application WO 2004/006290, a cover is placed directly on a substrate supporting the microcomponent, thus forming a first cavity. The getter is located in a second cavity hollowed in the substrate from a face opposite that on which the microcomponent is located. The two cavities communicate through at least one conduit that passes through the substrate. The production of such a microcomponent is time-consuming and complex. However, the bulk is reduced with respect to that of the configurations mentioned above.

In the patent application WO 2004/065289, it is recommended either to deposit the material of the getter on a support and to seal this coated support in the cavity delimited by the cover, or to coat the inside of the cover with the material of the getter. The main disadvantage of this configuration is that the getter will be saturated in the cover sealing steps and it must be protected if this is to be avoided.

The production of a cover with thin films is a technique more widely used in this type of microcomponent. This technique is described, for example, in the European patent applications EP 0 525 764 and EP 1 101 730. The cavity delimited by the cover leaves around the active portion of the microcomponent only a space of some dozens or hundreds of micrometers and a space of some micrometers or some dozens of micrometers above the microcomponent. It is not possible to house a discrete getter therein.

DESCRIPTION OF THE INVENTION

This invention is intended to overcome the disadvantages of the encapsulated microcomponents equipped with a getter as described above.

Another aim of the invention is to propose an encapsulated microcomponent equipped with a getter that can be produced in its entirety by a collective production process.

Another aim of the invention is to propose an encapsulated microcomponent equipped with a getter and of which the cover can be made of thin films.

Another aim of the invention is to propose an encapsulated microcomponent equipped with a getter that does not risk being saturated before completion of the microcomponent and that therefore does not need to be protected in order to avoid this saturation, or even be activated before the first operation.

Another aim of the invention is to propose an encapsulated microcomponent equipped with a getter that can serve as a reinforcement for the cover.

To achieve these aims, this invention is an encapsulated microcomponent having a cover delimiting a sealed cavity and equipped with at least one orifice provided with a plug that comprises a portion made of a getter material exposed inside the cavity.

It is possible for the plug also to comprise at least one sealing portion that is superimposed on the getter material portion.

The getter material of the getter material portion preferably has a column structure so as to have the best possible gas absorption capacity.

Alternatively, to improve the seal of the cover, it is possible for the material of the getter material portion to have a first column structure area that is extended by a second crystallised structure area, wherein the column structure area is farther from the cover than the crystallised structure area.

It is possible, for example, to choose the getter material from titanium, vanadium, zirconium, barium or mixtures thereof.

The sealing portion can be made of a metal material chosen from gold, platinum, chromium, aluminium or mixtures thereof or a dielectric material chosen from silicon nitride or silicon oxide.

The plug can come into contact with the substrate at the level of its getter material portion.

The cover can comprise a portion that delimits an active cavity and a portion that delimits a pump channel of lower thickness than the active cavity, wherein the active cavity communicates with the pump channel, and the orifice leads to the pump channel and/or to the active portion.

In another configuration, the cover comprises a top wall in which the plug is located.

An active portion of the microcomponent is housed in the cavity and is supported by a substrate with which the cover comes into contact. It is possible for the getter material portion to pass through a hole provided in the active portion.

As the cover comes into contact with the substrate, one electrode of an electrode pair in a device for activation of the getter material can be inserted between the getter material portion of the plug and the substrate.

The other electrode of the electrode pair of the device for activation of the getter material can be borne by the cover, with this other electrode extending either inside the cavity or outside the cavity and coming into contact with the getter material near the orifice.

The other electrode of the electrode pair of the device for activation of the getter material can serve as a sealing portion.

This invention also relates to a method for producing an encapsulated microcomponent comprising steps consisting of:
- covering, with a sacrificial material, a substrate supporting an active portion of the microcomponent, which sacrificial material serves as shape for the microcomponent cover;
- depositing, on the sacrificial material, an encapsulation material so as to form a cover delimiting a cavity;
- opening one or more orifices in the encapsulation material;
- removing the sacrificial material through the orifices;
- depositing a getter material on the cover so that it is exposed inside the cavity and totally or partially plugs the orifices.

The getter material can be deposited by vacuum deposition, on a surface of which the temperature is between around 0.2 and 0.5 times the melting temperature of the getter material at least at the beginning, so as to obtain a column deposit structure of the getter material, with the temperatures being expressed in degrees Kelvin.

The getter material can be deposited afterward, under the same pressure conditions, but on a surface of which the temperature is greater than around 0.5 times the melting temperature of the getter material so as to obtain a crystallized deposit structure of the getter material.

To improve the seal, it is possible to provide a step of deposition of a first sealing layer, and optionally a second sealing layer on the first sealing layer, wherein the first and the second sealing layers are superimposed on the getter material.

The first sealing layer can be deposited substantially at the same pressure as the deposition of the getter material.

It is possible to provide a step of etching the getter material as well as the first sealing layer, if it exists, so as to preserve, at the level of each orifice, only a plug and thus reduce the volume of the encapsulated microcomponent, and in the case, for example, of an optical component, to not mask the optical radiation to be detected or emitted.

Similarly, it is possible to provide a step of etching the second sealing layer in order to complete the plug.

It is also possible to provide a step of deposition, on the substrate, of an electrode, for each orifice, of a device for activation of the getter material, which electrode has an end located opposite the orifice, intended to come into electrical contact with the getter material.

There is then a step of depositing another electrode of the device for activation of the getter material, either on the sacrificial material, or on the encapsulation material, which other electrode must come into contact with the getter material near the orifice.

It is possible to include a degassing step after the step of removing the sacrificial material and before the step of depositing the getter material so as to limit the amount of gas to be absorbed by the getter material throughout the lifetime of the microcomponent.

BRIEF DESCRIPTION OF THE DRAWINGS

This invention can be better understood on reading the description of examples of embodiments provided purely for non-limiting indicative purposes, in reference to the appended drawings, in which.

Identical, similar or equivalent parts of the various figures have the same numerical references for the sake of consistency between figures.

The various parts shown in the figures are not necessarily shown according to a uniform scale, so as to make the figures easier to read.

DETAILED DESCRIPTION OF SPECIFIC EMBODIMENTS

Figure 1A:
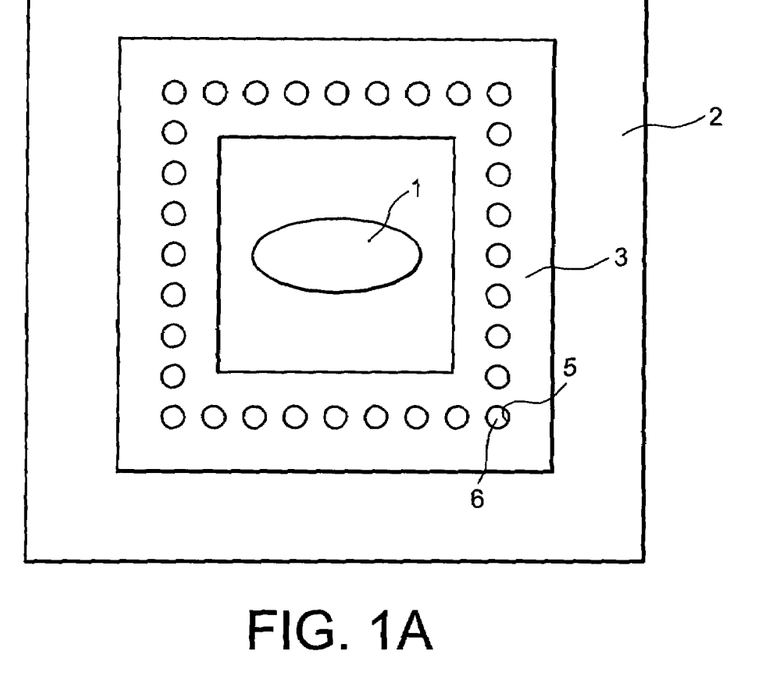
FIGS. 1A and 1B show at top view and a cross-section of a first example of a microcomponent according to the invention.
Figure 1B:
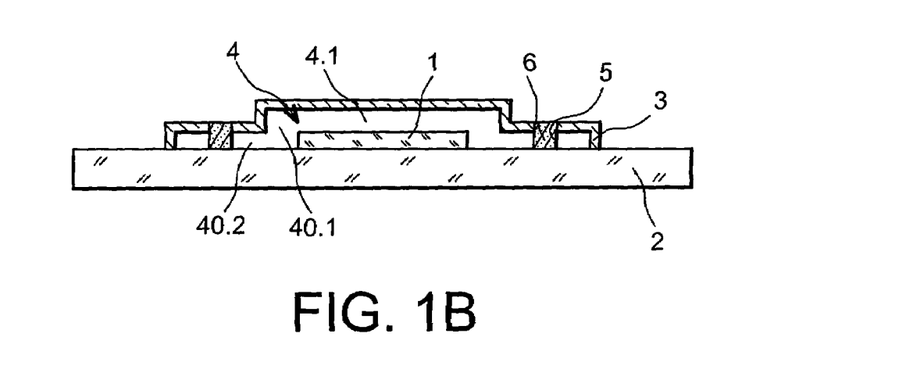
Figure 4A:
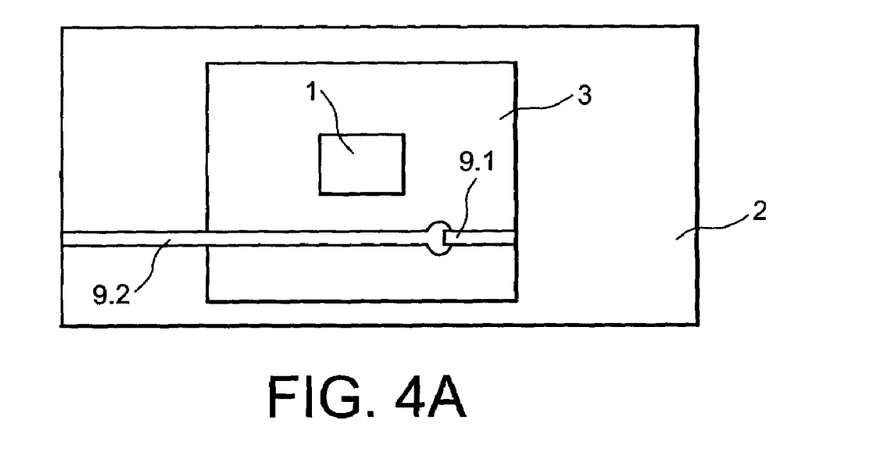
FIGS. 4A, 4B and 4C show other examples of microcomponents according to the invention.
Figure 4B:
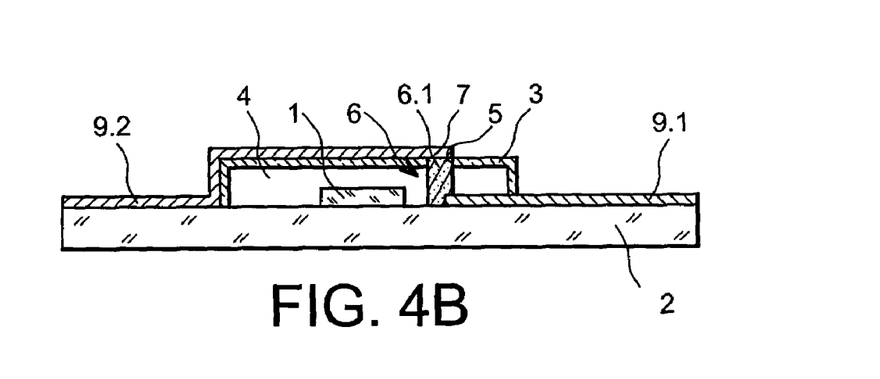
Figure 4C:
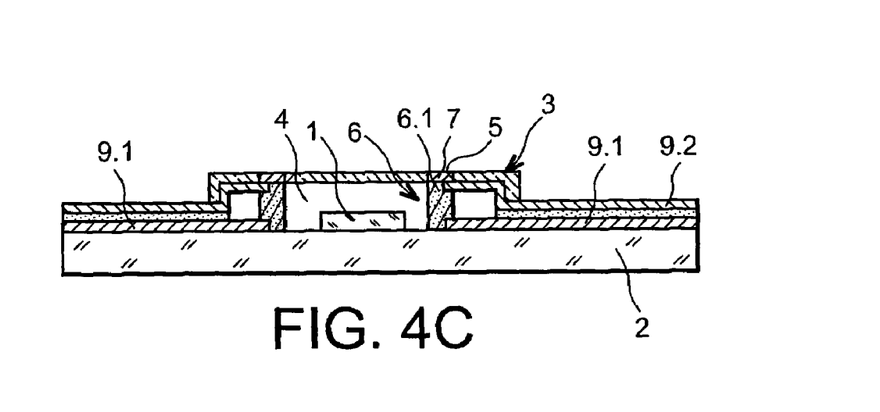

We will now refer to FIGS. 1A and 1B, which show an example of an encapsulated microcomponent according to the invention. The encapsulated microcomponent according to the invention comprises an active portion 1, for example an actuator, a resonator or any other electronic, optical, optoelectronic or electromechanical component, supported by a substrate 2. A cover 3 covers the active portion 1 and delimits a cavity 4 in which the active portion 1 is contained. The cover 3 comes into contact with the substrate 2. This cover 3, which has been produced by thin film technology, comprises at least one orifice 5 for removal of a sacrificial material (not shown) that has served to delimit the inside contour of the cover 3, i.e. the cavity 4. This orifice 5 is plugged by a plug 6 having at least one portion 6.1 made of a getter material exposed inside the cavity 4. The plug can be made entirely of the getter material if it is sufficiently sealed for the envisaged application. If this is not the case, it is possible to adjoin at least one sealing portion 7 to it as shown in FIG. 4C.

This configuration will also be used if the pressure in the cavity 4, when the getter material is deposited, is not low enough with respect to that required during operation of the microcomponent. The getter material portion 6.1 does not completely obstruct the orifice, and when the pressure inside the cavity 4 has reached the required value, the orifice 5 is obstructed in a sealed manner with the sealing portion 7, which completes the plug 6.

The getter material can be chosen for example from titanium, vanadium, zirconium, molybdenum, barium or mixtures thereof. The choice of getter material is made according to temperature constraints, the type of gases to be trapped and the required pumping capacity.

The sealing portion 7 can be based on gold, platinum, chromium, aluminium or even silicon nitride or silicon oxide, for example.

The getter material portion 6.1 of the plug 6 will be sufficiently sealed if its thickness is sufficient.

It is also possible to achieve the desired seal by modifying, during production of the plug, the structure of the getter material, as will be described below.

The amount of getter material to be used is calculated so that it can absorb all of the impurities that may appear in a cavity 4 of volume V with a pressure P during the operation of the microcomponent. It can be defined by its surface S, which is located inside the cavity 4 and which is expressed by:

$S = (P \times V)/(\alpha \times C)$ with $\alpha$ being the activation level of the getter material and C being the pumping capacity of the getter material in $Pa/cm^3/cm^{-2}$. The theoretical pumping capacity of titanium is very high, at $5.2 \times 10^4$ $Pa/cm^3/mg^{-1}$, which represents $2.7 \times 10^4$ $Pa/cm^3/mg^{-1}$ for a thickness of 1 micrometer.

This formula is applied to a cavity 4 of which the volume is 200×200×4 square micrometers, in which the pressure is $6.7 \times 10^{-1}$ Pa. It is considered that the actual pumping capacity of the titanium used is $1.34 \times 10^2$ $Pa/cm^3/cm^{-2}$ and that its activation level is 50%. The active surface of the getter material in contact with the inside of the cavity 4, to have the required pumping capacity becomes $$S = [6.7 \times 10^{-1} \cdot (200 \times 10^{-4})^2 / 4 \times 10^{-4}]/0.5 \times 133.3$$

$$S = 1.6 \times 10^{-7} cm^2$$

Figure 3:
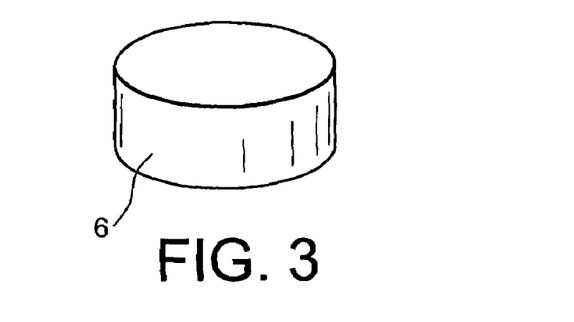
FIG. 3 shows a plug made of a getter material intended to plug the cover of the microcomponent of the invention.

This surface value can be obtained, for example, by six cylindrical plugs with a circular cross-section of which the diameter is 2 micrometers and the height of the usable surface in the cavity 4 is 1 micrometer. Such plugs 6 are shown in FIG. 3. It is assumed that they are made entirely of the getter material with a column structure.

It is preferable, for a given amount of getter material, to distribute it over a plurality of plugs 6 instead of a single one, which risks weakening the cover 3.

The orifices 5 to be plugged by the getter material are not necessarily circular. They can have a length-to-width ratio greater than one, be oblong as shown in FIG. 1A or be quadrilateral. When choosing their shape and size, it is simply necessary to make sure that they do not weaken the cover and that they can be properly plugged.

In FIG. 1A, it is assumed that the cover 3 has a square grip of 210 micrometers per side on the substrate 2. It is formed by central portion 3.1 that delimits an active cavity 40.1 in which the active portion 1 of the microcomponent and a peripheral portion 3.2 that delimits a pump channel 40.2 are located. The central portion 3.1 can be a square with sides of 200 micrometers. The active cavity 40.1 and the pump channel 40.2 communicate.

The height of the active cavity 40.1 is greater than that of the pump channel 40.2. In the example of FIGS. 1A and 1B, it is assumed that the height of the central portion is 4 micrometers and that of the peripheral portion is 1 micrometer.

The orifices 5 are distributed in the peripheral portion 3.2. It is assumed that on the four sides of the peripheral portion, 51 orifices 5 that are 2 micrometers in diameter are distributed substantially regularly. The orifices 5 thus distributed delimit a square with sides of 204 micrometers. There is thus a total of 204 orifices. The step of the circular orifices is 4 micrometers. If the orifices are plugged by titanium plugs, as shown in FIG. 3, the pumping capacity is brought to $4.2 \times 10^{-4}$ $Pa/cm^3/cm^{-2}$. This pumping capacity can easily compensate for the rises in pressure due to degassings and to the passage of gas through the materials constituting the microcomponent, throughout its entire lifetime. Alternatively, it would be possible to use oblong or quadrilateral orifices, as in FIG. 2A, having the same pumping surface.

The getter material portion 6.1 of a plug 6 comes into contact with the substrate 2, due to the deposition process used in the assembly described. In fact, nothing requires it to be in contact with the substrate.

Figure 2A:
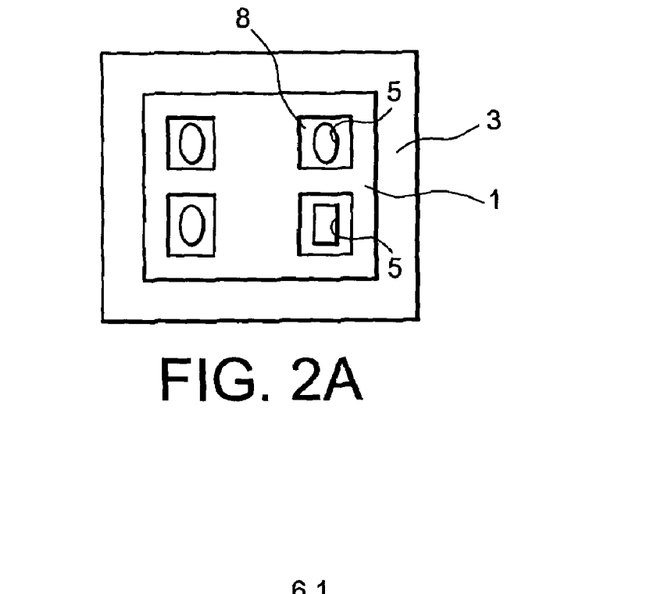
FIGS. 2A and 2B show a top view and a cross-section of another example of a microcomponent according to the invention.
Figure 2B:
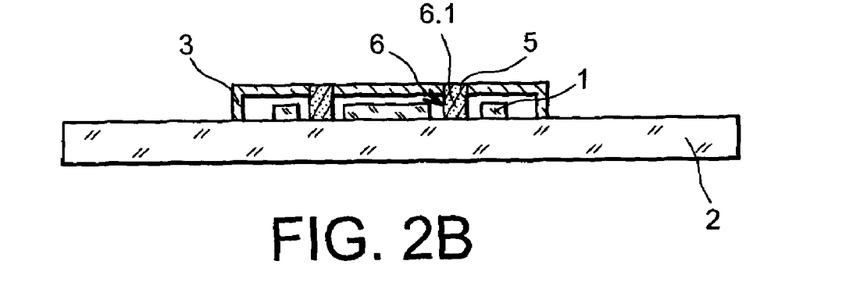

In FIG. 2, the cover comprises only a single portion that delimits the cavity 4 in which the active portion 1 is located with a top wall 4.1 and side walls 4.2. It is not necessary to confine the orifices 5 at the periphery of the top wall 4.1. The latter can be located in the central portion of the top wall 4.1 above the active portion 1. This configuration makes it possible to gain space on the substrate with respect to the one shown in FIGS. 1A and 1B. The entire surface of the top wall 4.1 is available for orifices 5. Insofar as the getter material portion 6.1 of the plugs 6 comes into contact with the substrate 2, the active portion 1 of the microcomponent is provided with a resist 8, for each plug 6, through which it can reach the substrate 2. The plugs 6 then form pillars of which the base is in contact with the substrate 2. This configuration is particularly recommended for large covers 3, for example those of which the top wall is on the order of at least 300 micrometers by 300 micrometers. Such plugs 6 act as a mechanical reinforcement for the cover 3 and they in no way hinder the operation of the active portion 1 of the microcomponent.

When producing the cover 3, it is possible to adapt its height, at least locally at the level of an orifice 5, so as to be capable, in a step of deposition, generally by low-pressure evaporation, as will be described below, of plugging this orifice 5. A height lower than, for example, 0.5 micrometers is too small and a height greater than a plurality of micrometers is too large. A value on the order of the micrometer is optimal for this type of material and this deposition process.

It is possible in this case to consider that in a cover 3 with a peripheral portion and a central portion, the orifices 5 are distributed both on the peripheral portion and on the central portion.

The process of deposition of the getter material, which will be described below, means that it may not be necessary to activate the getter material just after the orifices are plugged. However, throughout the life of the microcomponent, an activation may be required when the getter material portion has a saturated surface, i.e. impurities that have been trapped at the surface will prevent the trapping phenomenon from continuing to work. It is simply necessary to heat the getter material to a temperature high enough for the trapped impurities to diffuse in depth and again make the surface operational. The active surface of the getter material is regenerated in order to preserve its pumping function. This regeneration can be achieved by the Joule effect produced by circulating a current through the plug. It is preferable not to generally heat the microcomponent, because this risks disturbing or even destroying its active portion. FIGS. 4A and 4B show a device for local activation of the getter material of the plug 6.

An electrode pair 9.1, 9.2 is provided, which cooperates with each plug 6 for the distribution and recovery of the current that will pass through it. One of the electrodes 9.1 extends over the substrate 2. It has an end that reaches the base of the plug 6 and is in electrical contact with it at the level of its getter material portion 6.1. The other electrode 9.2 is supported by the cover 3. It can be located inside the cavity 4 as shown in FIG. 4C or outside as shown in FIG. 4B. It is arranged so that the electrode 9.2 supported by the cover 3 does not disturb the optical radiation to be detected or emitted by the active portion 1 of the component if it is optical, as shown in FIG. 4A.

The other electrode 9.2 can also have an end that reaches the top of the plug 6 and preferably the top of its getter material portion 6.1. It comes into electrical contact with the getter material near the orifice 5. This alternative is also suitable if there is the sealing portion 7. The two electrodes 9.1 and 9.2 of a pair are electrically isolated from one another.

The electrodes 9.1 and 9.2 can be made for example with a gold and chromium alloy or a gold and titanium alloy, with the chromium and the titanium ensuring the adhesion of the gold.

The electrode 9.2 is located at least partially at the level of the orifice 5 so that the getter material is deposited at least partially above so as to ensure electrical contact.

If the electrode 9.2 is located outside of the cavity 4 as in FIG. 4B, and it totally covers the surface of the getter material portion 6.1 of the plug 6 closest to the orifice 5 of the cover 3, the end of this electrode 9.2 can act as a sealing portion 7. In this case, it will be deposited in the same vacuum chamber as the one used to produce the getter material portion 6.1 of the plug 6.

Alternatively, as shown in FIG. 4C, it is possible for the surface of the electrode 9.1 or 9.2 in contact with the getter material to be as small as possible so as not to excessively reduce the surface of the getter material exposed in the cavity 4. The surface of the getter material portion 5.1 closest to the orifice 5 and/or the base of the plug 6 can be in only partial contact with the corresponding electrode 9.1 or 9.2. With this structure, the largest possible free surface of the getter material in terms of pumping capacity is thus preserved.

We will now discuss an example of a method for producing an encapsulated microcomponent according to this invention.

Figure 5A:
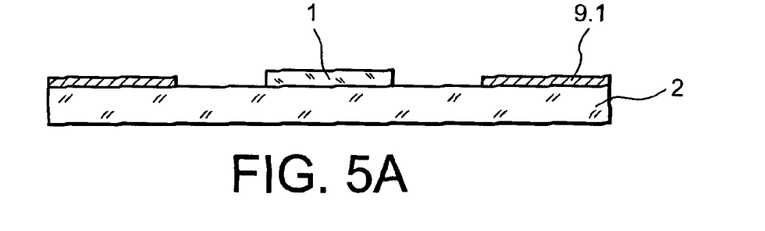
FIGS. 5A to 5K show various steps of a method for producing a microcomponent according to the invention.

We start with a substrate 2, which supports the active portion 1 of the microcomponent (FIG. 5A). This step will not be described further because it does not present a problem for a person skilled in the art and depends on the type of microcomponent envisaged.

If we provide an electrode pair for activating the getter material of each plug, one of the electrodes 9.1 of each pair is deposited on the substrate 2. An end of this electrode 9.1 will be located in the place where the getter material portion of the plug stops on the substrate 2, i.e. opposite the orifice, which will be made later. The other end will be accessible from outside the cover. The electrodes 9.1 and 9.2 can be made of gold titanium or gold chromium alloy as mentioned above. The electrode 9.1 can be deposited by cathode sputtering or vacuum deposition, for example.

Figure 5B:
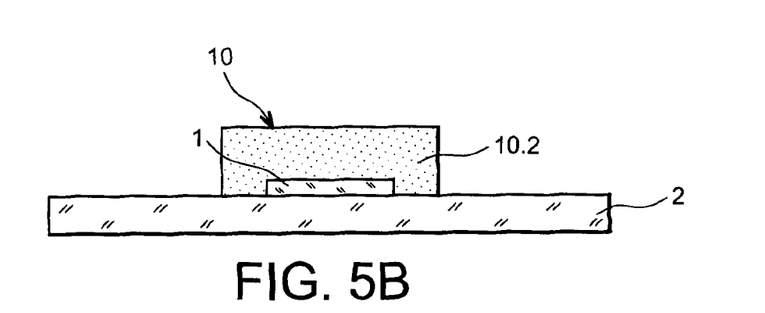
Figure 5C:
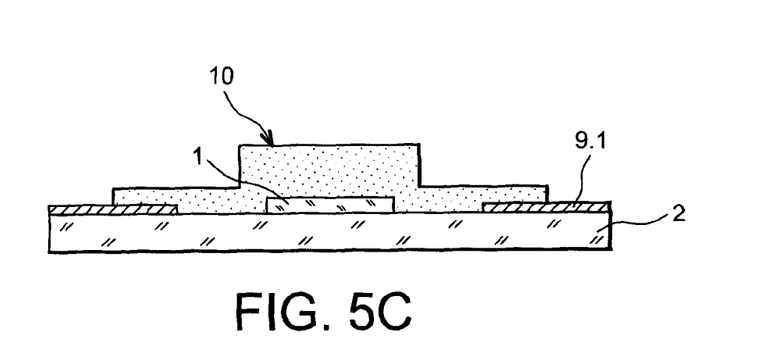

One or two layers 10.1 and 10.2 of sacrificial material will be deposited on the substrate 2 and the active portion 1. It is assumed in the example of FIG. 5B that only one layer 10.2 has been deposited because the cover delimits only one cavity above the active portion of the microcomponent and the microcomponent does not have a device for activation of the getter material. By contrast, in FIG. 5C, two layers 10.1 and 10.2 are deposited, with the first 10.1 helping to delimit the pump channel and the second helping to delimit the active cavity above the active portion of the microcomponent. The sacrificial material 10 can be, for example, a polymer such as a photosensitive resin, for example that of the JSR Corporation, of reference JSR PFR420, or of the AZ4562 type. Each of the layers 10.1 and 10.2 is annealed after their deposition at a temperature of around 350° C. The annealing is done after the delimitation, which is explained below.

By photolithography, each of the layers 10.1 and 10.2 is delimited after deposition on the inside contour of the pump channel and the active cavity. If there is only one deposited layer, the delimitation is performed at the contour of the inside of the cavity. The first layer 10.1 of sacrificial material can have a thickness of around 0.2 to 1 micrometer, while the second layer 10.2 (or the single layer) can have a thickness of around 4 to 10 micrometers above the active portion of the encapsulated microcomponent.

Figure 5D:
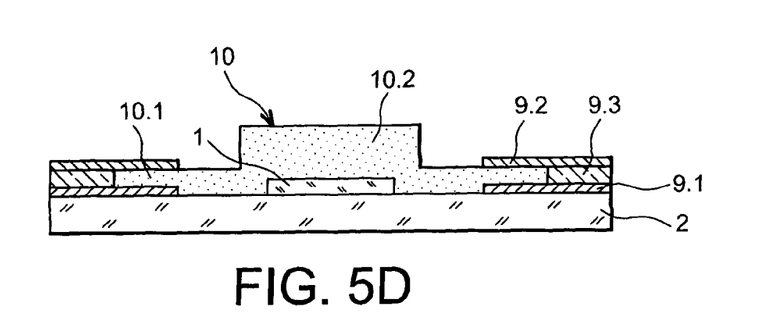

If an electrode pair 9.1, 9.2 is provided for activation of the getter material and the second electrode 9.2 must be located inside the cavity, it is deposited on the sacrificial material 10, after its delimitation, making sure that it does not come into contact with the first electrode 9.1 of the pair. FIG. 5D shows the second electrode 9.2. It is assumed that at the level of the substrate 2, it is above the first electrode 9.1, being isolated therefrom by dielectric material 9.3. It will have an end accessible to the outside of the cavity. The second electrode 9.2 can be, for example, deposited by cathode sputtering or vacuum deposition.

It is then assumed that the second electrode 9.2 will be deposited outside of the cavity and that its deposition will therefore take place after the production of the cover. In this embodiment, the deposition is preferably performed by vacuum deposition.

Figure 5E:
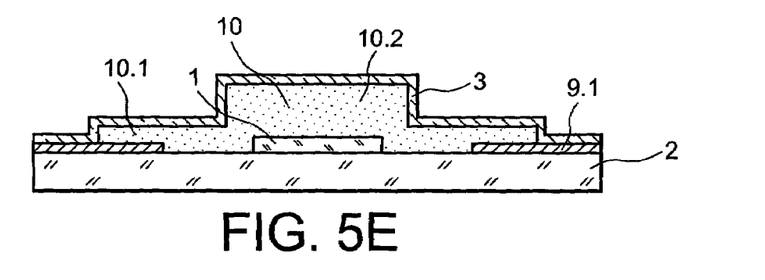

Therefore, on the sacrificial material 10 thus delimited, the cover 3 is deposited in one or more layers of encapsulation material. The deposition is a conformal deposition. This step is shown in FIG. 5E. This FIG. 5E shows the production of a cover 3 delimiting a cavity 4 with an active portion 4.2 and a pump channel 4.1. The rest of the process has not been shown for the case in which the cover does not have a pump channel so as not to add unnecessary figures. The same steps are used in both cases.

The encapsulation material 3 is preferably a dielectric material such as silicon oxide or silicon nitride. When a multilayer deposition is provided, it is possible to alternate these two materials. Other materials can be envisaged, such as amorphous silicon.

The deposition can be, for example, a plasma-enhanced chemical vapour deposition (PECVD), or a low-pressure chemical vapour deposition (LPCVD).

The thickness of the encapsulation material forming the cover 3 can be between around 1 and 3 micrometers. A silicon nitride SiN or $Si_3N_4$ or silicon oxide $SiO_2$ cover can have a thickness of between 1 and 3 micrometers. A typical thickness of a silicon oxide cover can be, for example, 1.5 micrometers.

Figure 5F:
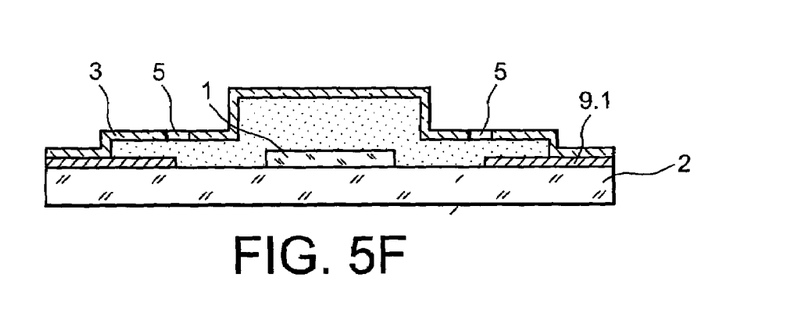

Then, in the encapsulation material, one or more orifices 5 will be etched (FIG. 5F). In the example described, the orifices 5 have been etched at the level of the pump channel, but it is of course possible to etch them at the level of the active portion of the cavity. The etching can be, for example, a dry plasma etching with fluorinated gas $CF_4$ or $SF_6$.

Figure 5G:
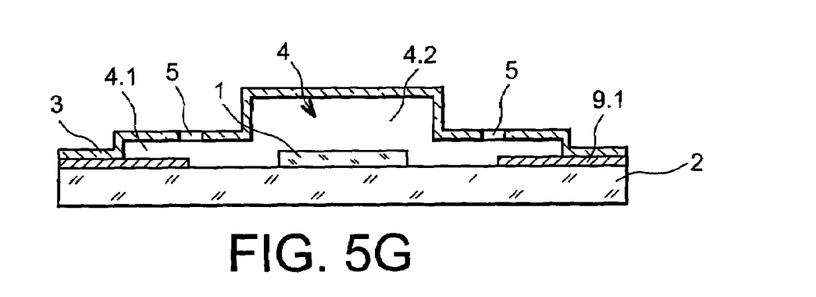

Then, the sacrificial material 10 will be removed through the orifices 5 (FIG. 5G). This removal can be done by exposure to an oxygen plasma that removes the organic residue.

It is possible then to proceed to a step of degassing the materials present inside the cavity 4. This can be done at high temperature under vacuum. It is possible, for example, to carry out this degassing at a temperature of 200° C. for several hours. This step is not essential, but it makes it possible to limit the amount of gas to be pumped throughout the lifetime of the microcomponent.

Figure 5H:
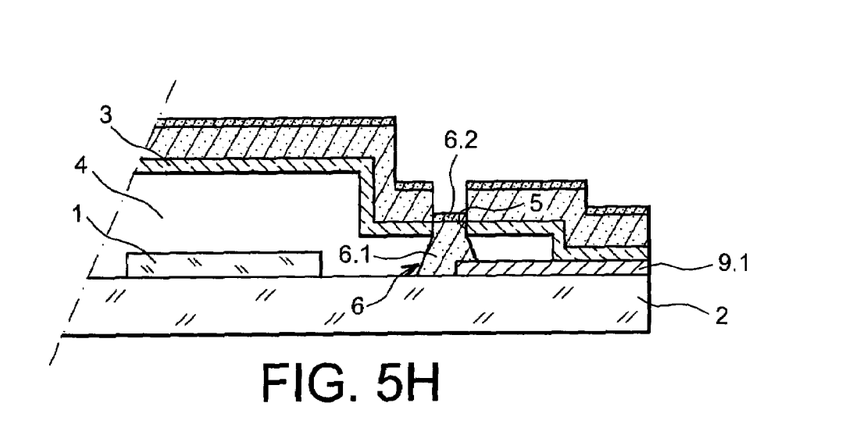

Then each orifice 5 is plugged with a plug 6, beginning with the getter material portion 6.1 (FIG. 5H). FIG. 5H is only a partial figure. This deposition, for example titanium, can be done by low-pressure evaporation, for example on the order of $5\times10^{-4}$ Pa. As this deposition technique is performed by low-pressure evaporation, the amount of gas to be pumped will be low if compared with that obtained with the vacuum sealing techniques at pressures that may be a thousand times higher.

The surface on which the getter material is to be deposited, i.e. the cover 3 and the substrate 2 inside the cavity, is brought to a temperature Td (in degrees Kelvin) so that the Td/Tf ratio is around 0.2 to 0.5. Tf represents the melting temperature of the getter material, for example, for titanium, 1941° K. With such deposition conditions, the titanium is deposited in a column structure. It is porous and has numerous boundaries between the various grains that constitute the layer, which leads to a large possible contact surface with the gas to be pumped, and is therefore conducive to a high pumping capacity.

In practice, a granular material is obtained: the grains are secured to one another by grain boundaries. The material owes its structure to the deposition conditions. The column structure corresponds to the most favourable case. In this case, the largest dimension of the columns corresponds to the direction of the deposition.

A person skilled in the art can use the Movchan and Demchishin model to determine the Td/Tf ratio that will give the best structure for a maximum getter effect suitable for the deposited material.

The getter effect is present as soon as a small amount of material is deposited, which material is deposited in the environment close to the active portion 1, which ensures an even lower pressure inside the cavity upon the start of the closure. The getter material is deposited on the substrate opposite the orifice with this type of process.

The deposition of the getter material portion 6.1 can ensure the hermetic sealing of the cavity if said portion is thick enough. It is assumed that this is the configuration shown in FIG. 2B, which is why it is not shown again.

It is possible during the deposition of the getter material to be led to change the deposition conditions so that it changes structure and recrystallises. This step is also shown in FIG. 5H. At this time, the deposit is sealed. The change in deposition conditions can be a change in temperature. It can be arranged to have a Td/Tf ratio greater than around 0.5. The recrystallised portion is referenced 6.2. It forms or helps to form the sealing portion of the plug 6. In this configuration, the getter material portion comprises a column structure area that is extended by a crystallised structure area.

Figure 5I:
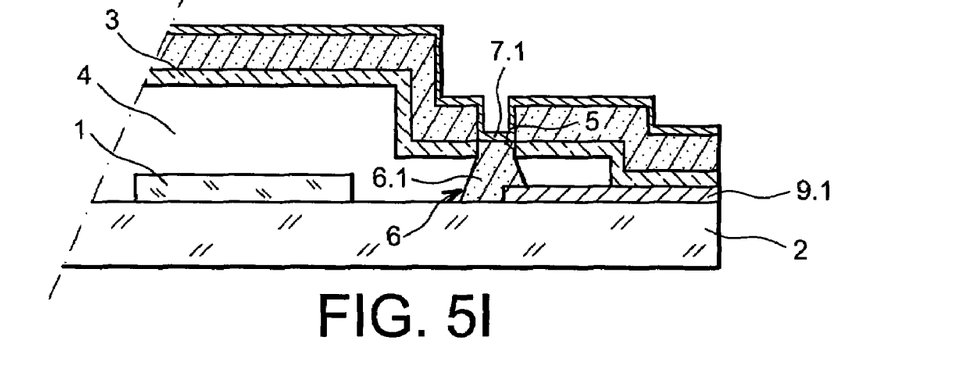

As an alternative or a complement, to obtain the seal, it is possible to change metals, while keeping the same pressure (FIG. 5I). It is possible for example to deposit a sealing layer 7.1 for example made of gold with a thickness of around 1 micrometer on the getter material and thus form or help to form the sealing portion. The temperature must be adapted to the new metal used. In this way, the getter material is not subjected to atmospheric pressure. The first sealing layer 7.1 can also be dielectric, as explained below for the second sealing layer 7.2.

Figure 5J:
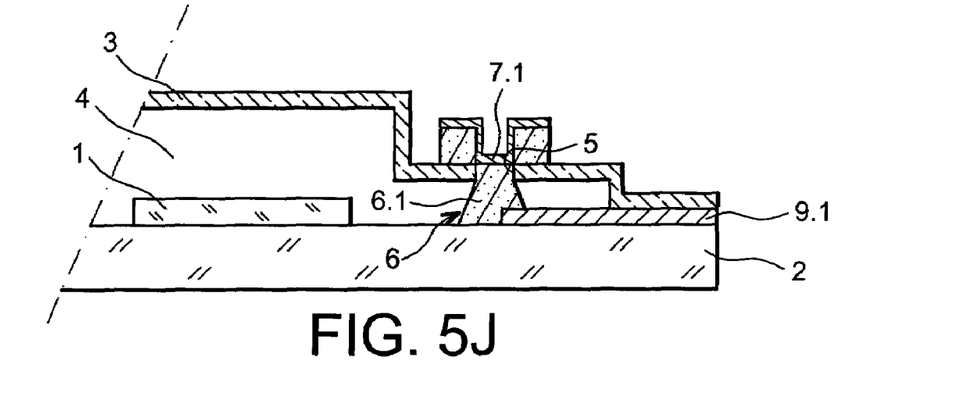

It is possible, during a conventional photolithography step, to etch the deposited material(s) in order to locally delimit the contour of the plugs 6 and remove said materials elsewhere, exposing the cover 3 (FIG. 5J). This step is particularly suitable if the component is an optical component, since the optical radiation that the component must emit or detect must not be masked. It is also possible to choose to preserve the material(s) deposited, but to locally delimit the contour of the plugs by etching. This step is optional. The sealing layer 7.1 can serve as a second electrode of the electrode pair of the device for activation of the getter material portion 6.1.

Figure 5K:
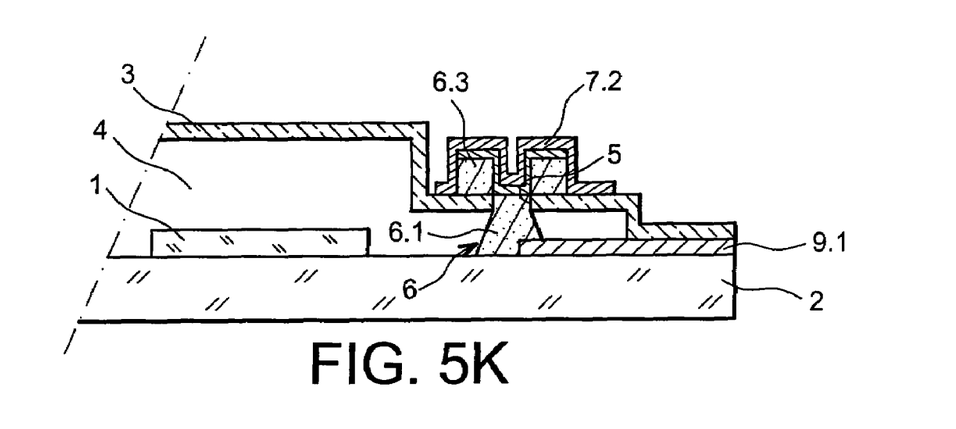

If the encapsulated microcomponent must have a very long lifetime, it can be advantageous to provide, in addition, a second sealing layer 7.2 on the plugs 6 so that they are in the stage of FIG. 5K in order to improve the sealing in the cavity 4. The sealing layer 7.1 is the first sealing layer. Said second sealing layer 7.2 is shown in FIG. 5K. This second sealing layer 7.2 can be metal or dielectric. The metal for the first sealing layer or the second sealing layer can be chosen from gold, platinum, chromium, aluminium or mixtures thereof. The list is not exhaustive. The dielectric of the second sealing layer can be chosen from $SiO_2$, SiN or $Si_3N_4$. The second sealing layer 7.2 can be made up of a plurality of layers of these materials. If there is no activation electrode, this second layer can be dielectric. This second sealing layer 7.2 reinforces the sealing of the plug, in particular at the level of lateral areas 6.4 of the plugs 6, which, after delimitation, expose the getter material outside of the cavity 4, i.e. at the level of step crossings. In the same way as above, the second layer 7.2 can be etched locally at the contour of the plugs 6 and removed elsewhere.

Although a number of embodiments of this invention have been shown and described in detail, it must be understood that various changes and modifications can be made without going beyond the scope of the invention. The various alternatives described must be understood as not necessarily being exclusive of one another.

The invention claimed is:

1. An encapsulated microcomponent having a cover that is in contact with a substrate and delimiting a sealed cavity equipped with at least one orifice provided with a plug,
    wherein the plug is arranged to seal the orifice and comprises a portion made of a getter material exposed inside of the cavity, the getter material arranged to be in contact with the substrate at a location opposite of the orifice.

2. A microcomponent according to claim 1, wherein the getter material of the getter material portion has a column structure.

3. A microcomponent according to claim 1, wherein the getter material is chosen from titanium, vanadium, zirconium, barium or mixtures thereof.

4. A microcomponent according to claim 1, wherein the plug comes into contact with the substrate at the level of its getter material portion.

5. A microcomponent according to claim 1, wherein the cover comprises a portion that delimits an active cavity and a portion that delimits a pump channel of lower thickness than the active cavity, wherein the active cavity communicates with the pump channel, and the orifice leads to the pump channel and to the active cavity.

6. A microcomponent according to claim 1, wherein the cover comprises a top wall in which the plug is located.

7. A microcomponent according to claim 1, wherein the plug is arranged to protrude downwards from the orifice of the cover towards the substrate, to be in contact with the substrate.

* * * * *